(12) United States Patent
Yi et al.

(10) Patent No.: US 9,966,383 B2
(45) Date of Patent: May 8, 2018

(54) SEMICONDUCTOR STRUCTURE AND MANUFACTURING METHOD THEREOF

(71) Applicant: UNITED MICROELECTRONICS CORP., Hsinchu (TW)

(72) Inventors: Liang Yi, Singapore (SG); Ko-Chi Chen, Taoyuan (TW); Shen-De Wang, Hsinchu County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days. days.

(21) Appl. No.: 14/950,424

(22) Filed: Nov. 24, 2015

(65) Prior Publication Data

US 2017/0110469 A1 Apr. 20, 2017

(30) Foreign Application Priority Data

Oct. 15, 2015 (TW) .............................. 104133857 A (51) Int. Cl.
*H01L 27/11578* (2017.01)
*H01L 29/423* (2006.01)

(52) U.S. Cl.
CPC .... *H01L 27/11578* (2013.01); *H01L 29/4236* (2013.01)

(58) Field of Classification Search
CPC ............. H01L 27/115; H01L 27/11521; H01L 27/11524; H01L 29/66825; H01L 21/28273; H01L 29/7881
See application file for complete search history.

(56) References Cited

U.S. PATENT DOCUMENTS

| | | | |
|---|---|---|---|
| 5,315,142 A | 5/1994 | Acovic et al. | |
| 8,207,583 B2 * | 6/2012 | Juengling | H01L 21/0337 257/216 |
| 8,518,775 B2 | 8/2013 | Liu et al. | |
| 9,082,837 B2 | 7/2015 | Perera | |
| 2004/0110349 A1 * | 6/2004 | King | H01L 21/265 438/289 |
| 2009/0121275 A1 * | 5/2009 | Kim | H01L 21/28273 257/321 |
| 2015/0137207 A1 | 5/2015 | Chuang et al. | |
| 2015/0187784 A1 * | 7/2015 | Tan | H01L 27/11551 257/321 |
| 2015/0194439 A1 | 7/2015 | Cheek et al. | |

* cited by examiner

*Primary Examiner* — Tony Tran
(74) *Attorney, Agent, or Firm* — WPAT, PC (57) ABSTRACT

A semiconductor structure and a manufacturing method thereof are provided. The semiconductor structure includes a semiconductor substrate, a non-volatile memory cell, and a gate stack. The non-volatile memory cell is formed in the semiconductor substrate, and a top surface of the non-volatile memory cell is coplanar with or below a top surface of the semiconductor substrate. The gate stack is formed on the semiconductor substrate.

7 Claims, 10 Drawing Sheets

SEMICONDUCTOR STRUCTURE AND MANUFACTURING METHOD THEREOF

This application claims the benefit of Taiwan application Serial No. 104133857, filed Oct. 15, 2015, the subject matter of which is incorporated herein by reference.

BACKGROUND

Technical Field

The present disclosure relates in general to a semiconductor structure and a manufacturing method thereof, and more particularly to a semiconductor structure having a high-voltage component and/or a low-voltage logic component and a non-volatile memory cell and a manufacturing method thereof.

Description of the Related Art

A high-voltage component, a low-voltage logic component, and a non-volatile memory component can be arranged in a single memory device. However, since the operation principles of the high-voltage component, the low-voltage logic component, and the non-volatile memory component are different from one another, the structures and the manufacturing processes of these components are different from one another as well. In order for these different components to achieve the best performances in a single device and in order to optimize the manufacturing process, industry has been working on developing and improving the performance and the manufacturing process of the memory device which is arranged with a high-voltage component, a low-voltage logic component, and a non-volatile memory component.

SUMMARY OF THE INVENTION

The present disclosure is directed to a semiconductor structure and a manufacturing method thereof. In the embodiments, the semiconductor structure includes a non-volatile memory cell and a logic gate, and a top surface of the non-volatile memory cell is coplanar with or below a top surface of the semiconductor substrate, such that the whole structure of the non-volatile memory cell is embedded within the semiconductor substrate; as such, the polishing process of the logic gate does not damage the non-volatile memory cell, and accordingly, the non-volatile memory cell can maintain an intact structure and excellent performance.

According to an embodiment of the present disclosure, a semiconductor structure is disclosed. The semiconductor structure includes a semiconductor substrate, a non-volatile memory cell, and a logic gate. The non-volatile memory cell is formed in the semiconductor substrate, and a top surface of the non-volatile memory cell is coplanar with or below a top surface of the semiconductor substrate. The logic gate is formed on the semiconductor substrate.

According to another embodiment of the present disclosure, a manufacturing method of a semiconductor structure is disclosed. The manufacturing method of the semiconductor structure includes the following step: providing a semiconductor substrate; forming a non-volatile memory cell in the semiconductor substrate, wherein a top surface of the non-volatile memory cell is coplanar with or below a top surface of the semiconductor substrate; and forming a logic gate on the semiconductor substrate.

The disclosure will become apparent from the following detailed description of the preferred but non-limiting embodiments. The following description is made with reference to the accompanying drawings.

DETAILED DESCRIPTION OF THE INVENTION

According to the embodiments of the present disclosure, a semiconductor structure and a manufacturing method thereof are provided. In the embodiments, the semiconductor structure includes a non-volatile memory cell and a logic gate, and a top surface of the non-volatile memory cell is coplanar with or below a top surface of the semiconductor substrate, such that the whole structure of the non-volatile memory cell is embedded within the semiconductor substrate; as such, the polishing process of the logic gate does not damage the non-volatile memory cell, and accordingly, the non-volatile memory cell can maintain an intact structure and excellent performance. The embodiments are described in details with reference to the accompanying drawings. The procedures and details of the manufacturing method and the structure of the embodiments are for exemplification only, not for limiting the scope of protection of the disclosure. Moreover, the identical elements of the embodiments are designated with the same reference numerals. Also, it is also important to point out that the illustrations may not be necessarily be drawn to scale, and that there may be other embodiments of the present disclosure which are not specifically illustrated. Thus, the specification and the drawings are to be regard as an illustrative sense rather than a restrictive sense. It is to be noted that the drawings are simplified for clearly describing the embodiments, and the details of the structures of the embodiments are for exemplification only, not for limiting the scope of protection of the disclosure. Ones having ordinary skills in the art may modify or change the structures according to the embodiments of the present disclosure.

Figure 1:
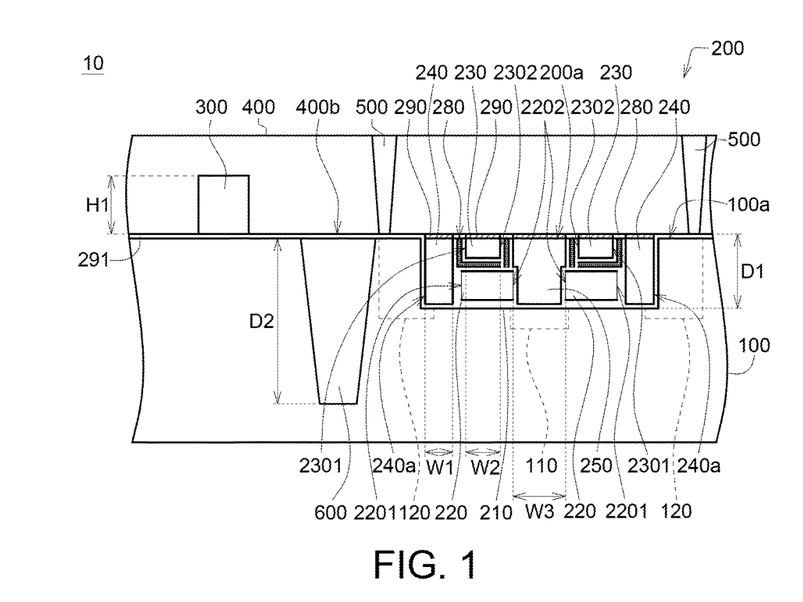
FIG. 1 is a schematic view of a semiconductor structure according to an embodiment of the present disclosure.

FIG. 1 is a schematic view of a semiconductor structure 10 according to an embodiment of the present disclosure. As shown in FIG. 1, the semiconductor structure 10 includes a semiconductor substrate 100, a non-volatile memory cell 200, and a logic gate 300. The non-volatile memory cell 200 is formed in the semiconductor substrate 100, and a top surface 200a of the non-volatile memory cell 200 is coplanar with or below a top surface 100a of the semiconductor substrate 100. The logic gate 300 is formed on the semiconductor substrate 100. In the embodiment as shown in FIG. 1, the top surface 200a of the non-volatile memory cell 200 is coplanar with the top surface 100a of the semiconductor substrate 100.

As shown in FIG. 1, the non-volatile memory cell 200 may include a floating gate dielectric 210, a floating gate (FG) 220, a control gate (CG) 230, a word line 240, and an erase gate (EG) 250. The floating gate 220 is formed on the floating gate dielectric 210, and the control gate 230 is formed on the floating gate 220. The word line 240 is formed on a first side 2201 of the floating gate 220 and a first side 2301 of the control gate 230. The erase gate 250 is formed on a second side 2202 of the floating gate 220 and a second side 2302 of the control gate 230. As shown in FIG. 1, the second sides 2202 and 2302 are opposite to the first sides 2201 and 2301.

In the embodiment, the semiconductor substrate 100 is such as a silicon substrate, and the materials of the floating gate 220, the control gate 230, the word line 240, and the erase gate 250 may be polysilicon or conductive metals.

In the embodiment, as shown in FIG. 1, the non-volatile memory cell 200 may include one erase gate 250, two floating gates 220, two control gates 230, and two word lines 240. The floating gates 220, the control gates 230, and the word lines 240 are arranged symmetrically with respect to the erase gate 250. Specifically speaking, the two control gates 230 are located respectively at two sides of the erase gate 250, and the two floating gates 220 are located respectively at two sides of the erase gate 250 and above the two control gates 230. The two word lines 240 are located respectively at two further-outer sides of the erase gate 250. One floating gate 220 and one control gate 230 are located between the erase gate 250 and one word line 240. In the embodiment as shown in FIG. 1, the non-volatile memory cell 200 is such as an SST-type non-volatile memory cell.

As shown in FIG. 1, the non-volatile memory cell 200 may further include a memory structure 280. The memory structure 280 is formed on sidewalls of the control gate 230. In the embodiment, the memory structure 280 is such as a composite layer of silicon oxide/silicon nitride/silicon oxide (ONO). In the embodiment as shown in FIG. 1, the memory structure 280 surrounds the three sidewalls of the control gate 230, and additionally, the memory structure 280 is located between the control gate 230 and the floating gate 220, the word line 240 as long with the erase gate 250.

As shown in FIG. 1, the semiconductor structure 10 may further include a source line 110 and a bit line 120. The source line 110 is formed below the erase gate 250. The bit line 120 is formed in the semiconductor substrate 110 and located on a lateral side 240a of the word line 240 opposite to the floating gate 220 and the control gate 230.

In the embodiment, as shown in FIG. 1, the semiconductor structure 10 includes a source line 110 and two bit lines 120, and the two bit lines 120 are located respectively at two sides of the non-volatile memory cell 200.

As shown in FIG. 1, the semiconductor structure 10 may further include a silicide layer 290. The silicide layer 290 is formed on top surfaces of the word line 240, the control gate 230, and the erase gate 250. In the embodiment, the semiconductor structure 10 may further include an oxide layer 291, and the oxide layer 291 is formed on the semiconductor substrate 100. In the embodiment as shown in FIG. 1, the silicide layer 290 is patterned and only formed on the top surfaces of the word line 240, the control gate 230, and the erase gate 250. The patterned portions of the silicide layer 290 located on the top surfaces of the word line 240, the control gate 230, and the erase gate 250 respectively are separated by the oxide layer 291.

As shown in FIG. 1, the semiconductor structure 10 may further include an interlayer dielectric (ILD) 400. The interlayer dielectric 400 is formed on the semiconductor substrate 100, and the top surface 200a of the non-volatile memory cell 200 is under a bottom surface 400b of the interlay dielectric 400.

As shown in FIG. 1, the semiconductor structure 10 may further include a contact plug 500. The contact plug 500 is formed in the interlayer dielectric 400, and the contact plug 500 is electrically connected to the non-volatile memory cell 200.

As shown in FIG. 1, the semiconductor structure 10 may further include an isolation structure 600. The isolation structure 600 is formed in the semiconductor substrate 100 and located between the non-volatile memory cell 200 and the logic gate 300. In the embodiment, the isolation structure 600 is such as a shallow trench isolation (STI).

In the embodiment, as shown in FIG. 1, the non-volatile memory cell 200 has a first depth D1 extending toward inside of the semiconductor substrate 100, and the logic gate 300 has a first height H1. The first depth D1 is such as larger than the first height H1. For example, the first depth D1 is such as larger than or equal to 1000 Å, and the first height H1 is such as about 500-550 Å.

In the embodiment, as shown in FIG. 1, the word line 240 has a cross-sectional width W1 of such as about 1000 Å, the control gate 230 has a cross-sectional width W2 of such as about 1000 Å, the erase gate 250 has a cross-sectional width W3 of such as about 2000 Å, and the isolation structure 600 has a depth D2 of such as about 2500 Å.

In the embodiments, the logic gate 300 may include a high-voltage gate.

In a traditional memory device, a non-volatile memory cell is formed on a semiconductor substrate followed by the formation of high-voltage/logic gate component(s) on the semiconductor substrate as well. However, since the height (e.g. 500 Å) of the gate in the high-voltage/logic gate component(s) is smaller than the height of the gate structure in the non-volatile memory cell (e.g. 2200 Å), while a polishing process is performed on the gate of the high-voltage/logic gate component(s), such polishing process would inevitably damage the gate structure in the non-volatile memory cell, resulting in the structural damage to the memory cell and rendering the memory cell to malfunction. In contrast, according to the embodiments of the present disclosure, the top surface 200a of the non-volatile memory cell 200 is coplanar with or below the top surface 100a of the semiconductor substrate 100; in other words, the non-volatile memory cell 200 is embedded within the semiconductor substrate 100. As such, no matter how large the vertical height (i.e. the depth D1) of the non-volatile memory cell 200 is, due to the fact that the whole structure of the non-volatile memory cell 200 is embedded within the semiconductor substrate 100, the polishing process of the logic gate 300 is definitely performed at a height (i.e. the height H1) above the surface 100a of the semiconductor substrate 100. Consequently, the polishing process of the logic gate 300 would never damage the non-volatile memory cell 200, such that the non-volatile memory cell 200 can maintain an intact structure and excellent performance.

Figure 2A:
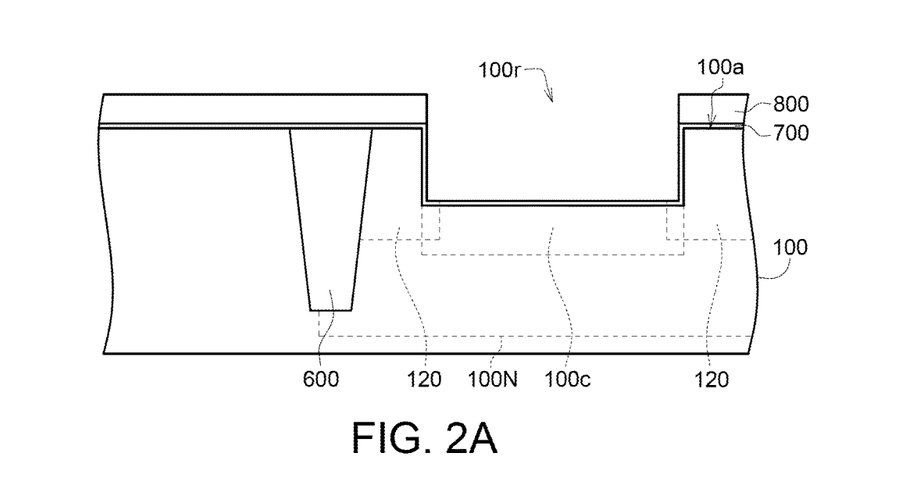
FIGS. 2A-2R show a manufacturing process of a semiconductor structure according to an embodiment of the present disclosure.
Figure 2B:
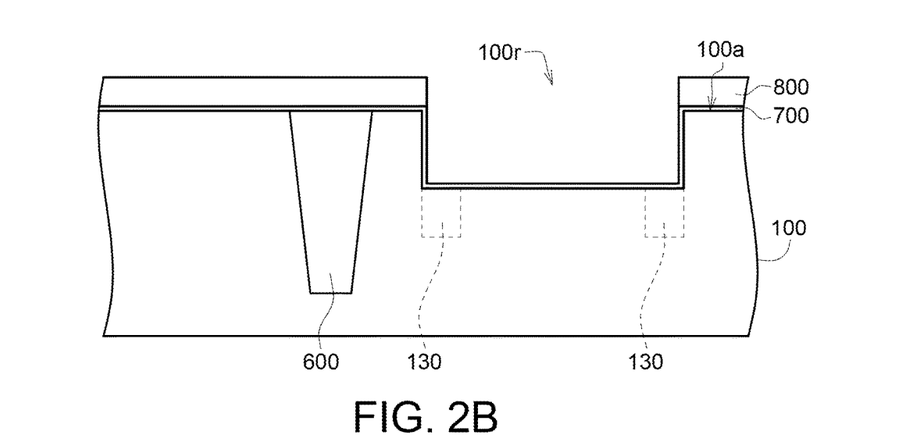
Figure 2C:
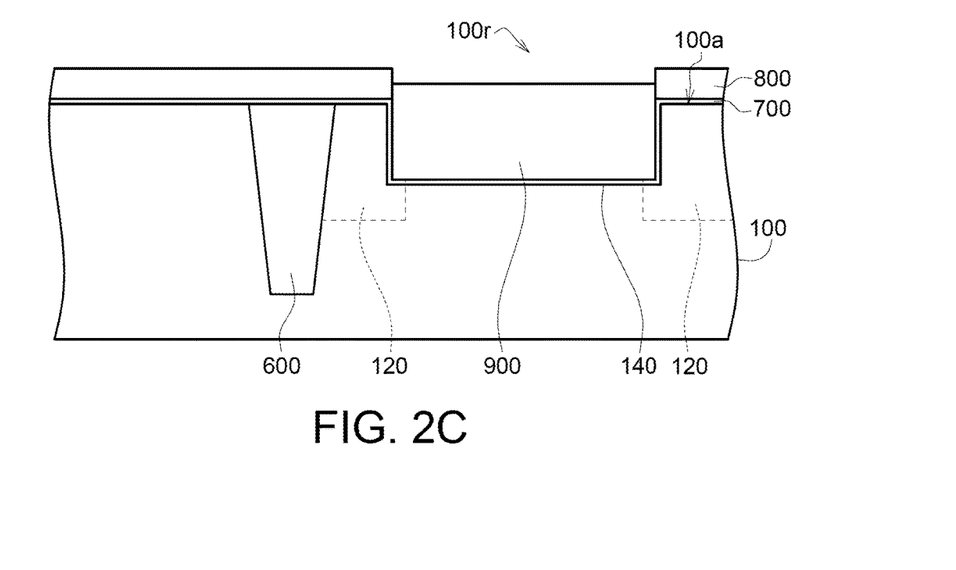
Figure 2D:
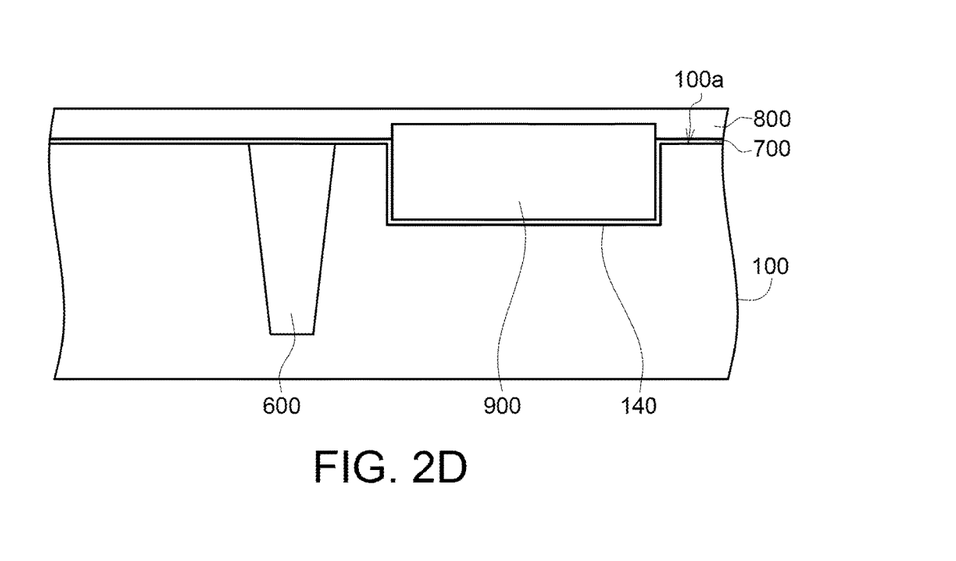
Figure 2E:
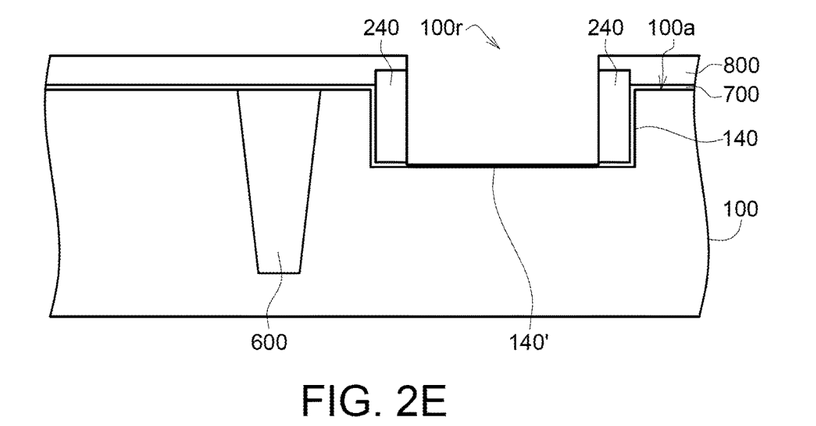
Figure 2F:
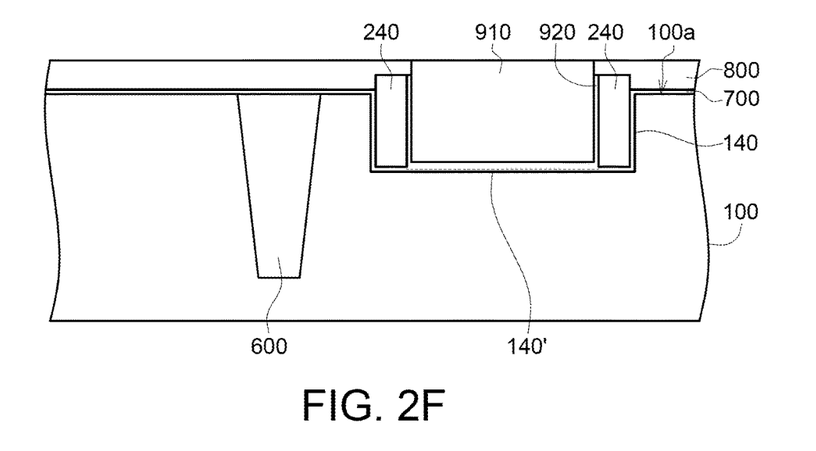
Figure 2G:
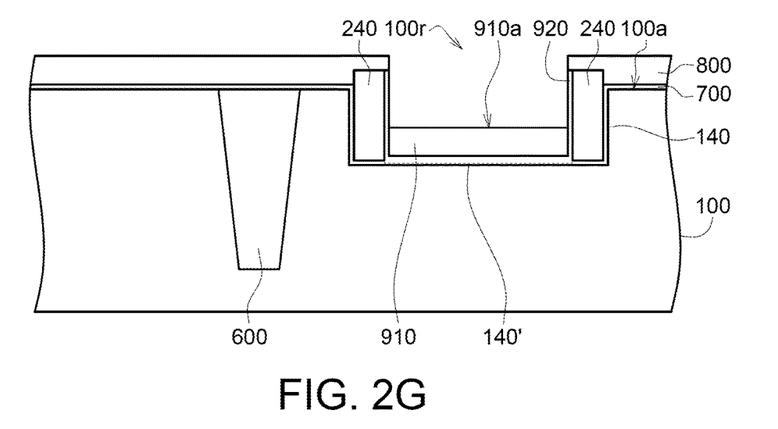
Figure 2H:
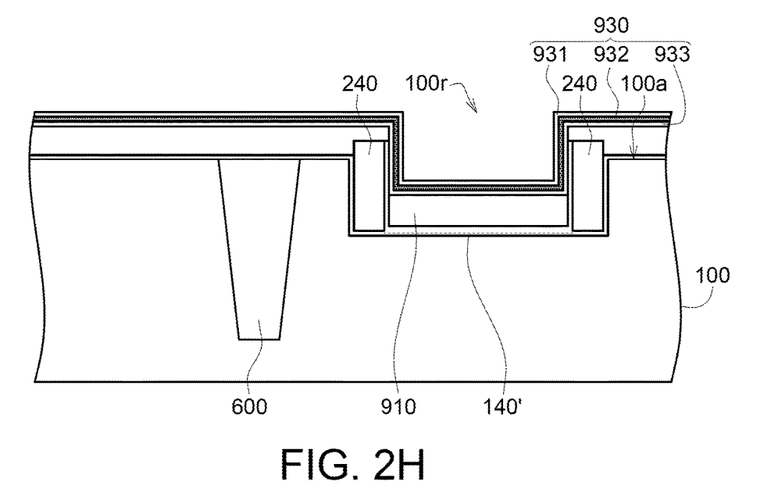
Figure 2I:
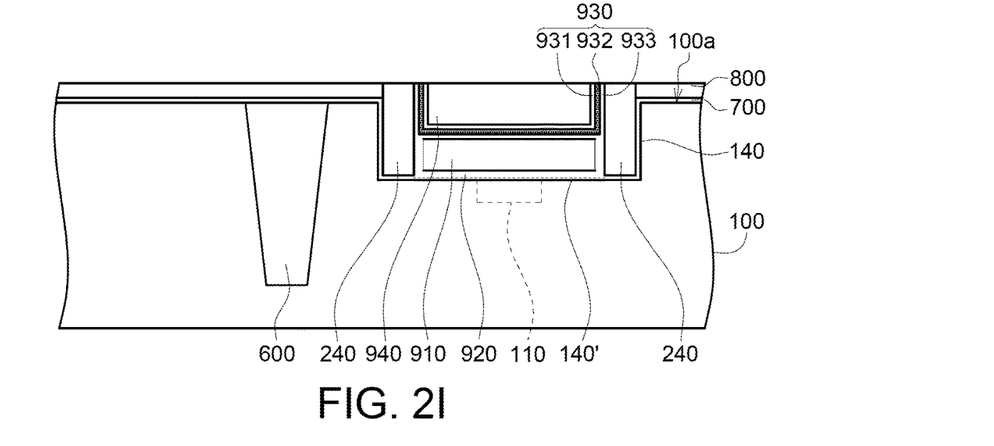
Figure 2J:
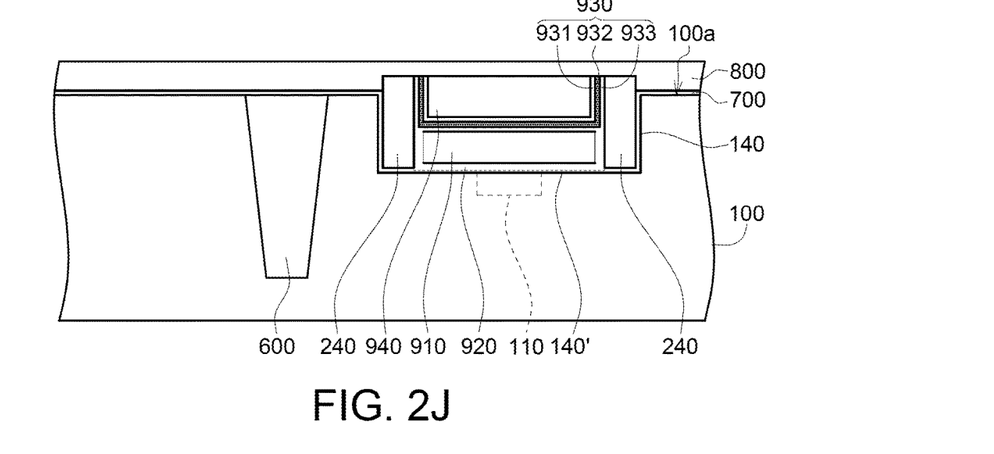
Figure 2K:
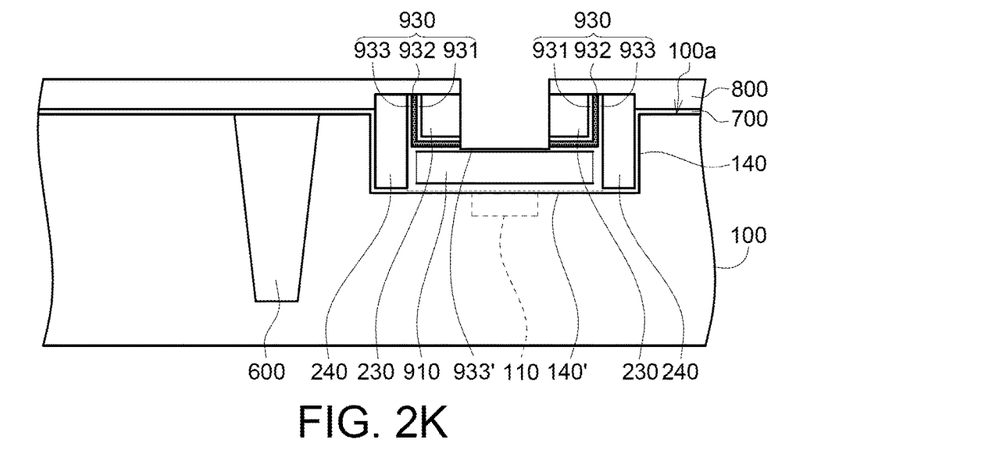
Figure 2L:
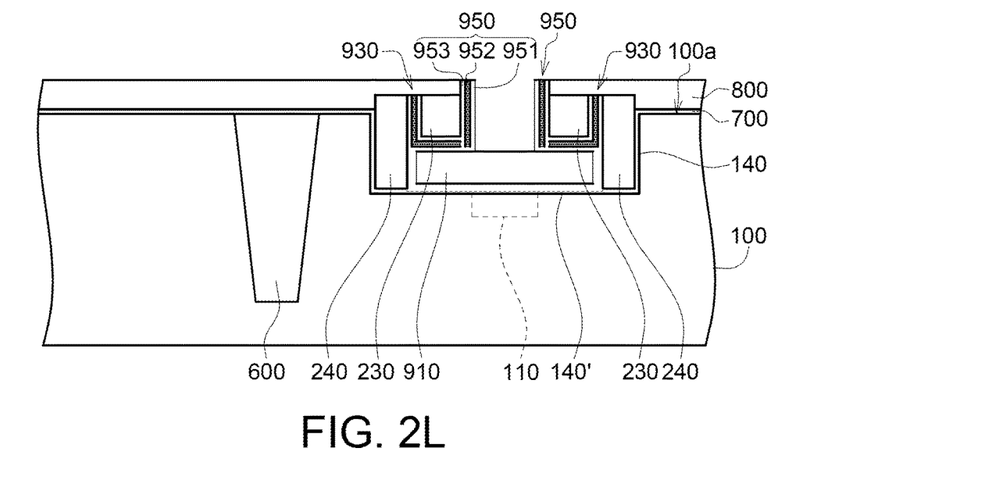
Figure 2M:
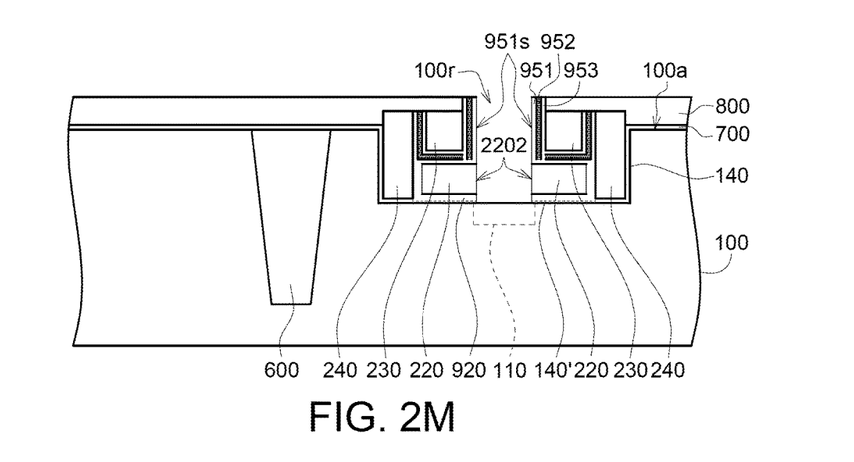
Figure 2N:
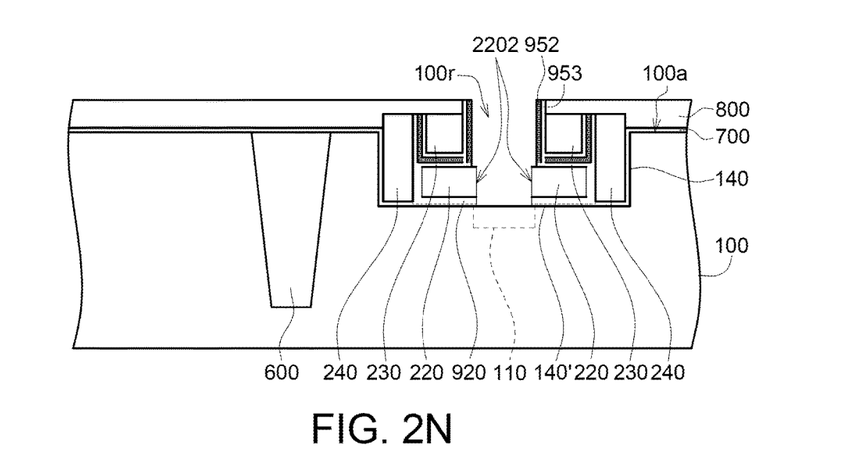
Figure 2O:
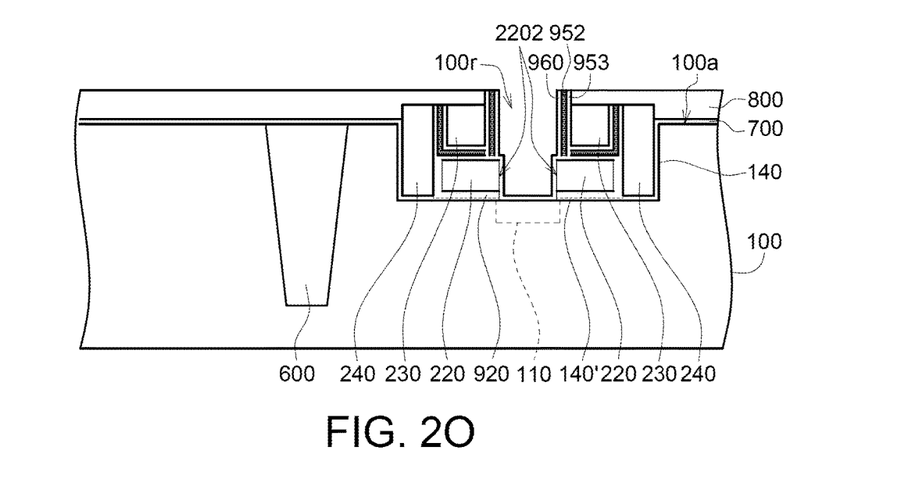
Figure 2P:
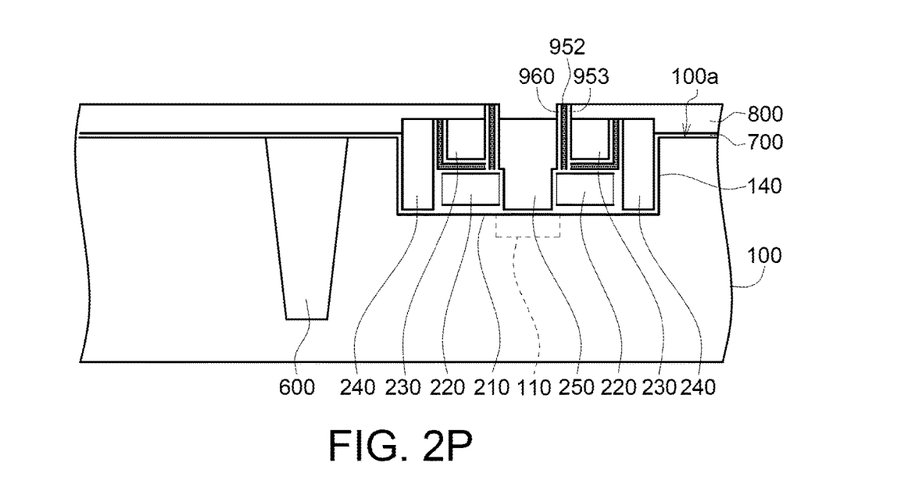
Figure 2Q:
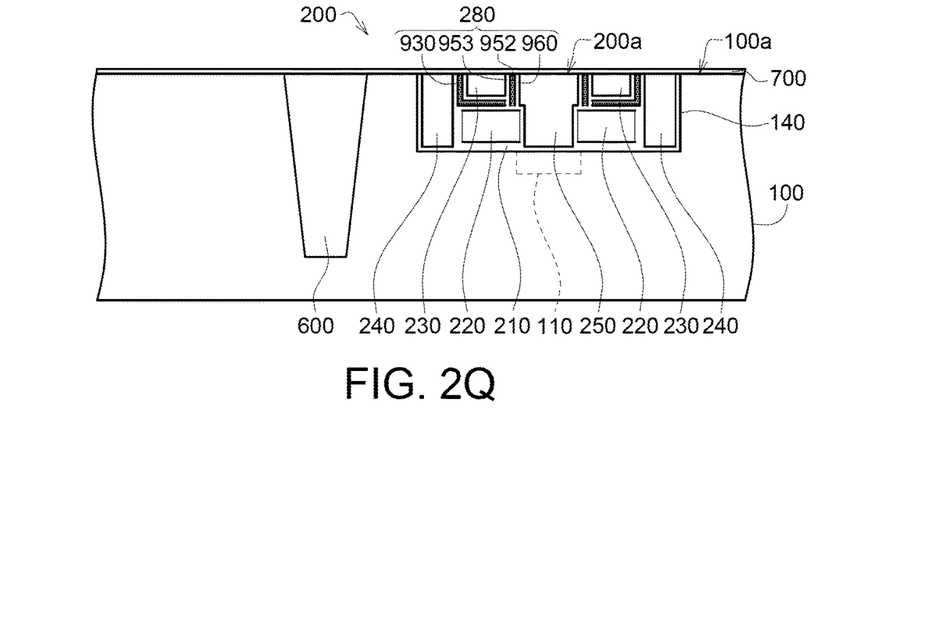
Figure 2R:
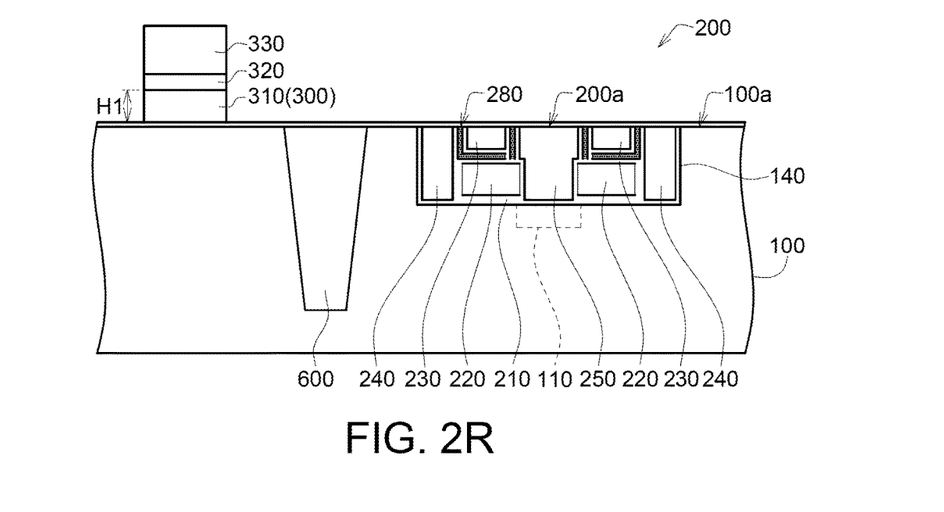

FIGS. 2A-2R show a manufacturing process of a semiconductor structure according to an embodiment of the present disclosure. The elements in the present embodiment sharing similar or the same labels with those in the previous embodiment are similar or the same elements, and the description of which is omitted.

As shown in FIG. 2A, a semiconductor substrate 100 is provided.

Next, a non-volatile memory cell 200 is formed in the semiconductor substrate 100. The manufacturing method of forming the non-volatile memory cell 200 includes such as the following steps.

As shown in FIG. 2A, a recess 100r is formed within the semiconductor substrate 100. In the embodiment, an isolation structure 600 is formed in the semiconductor substrate 100, and then a deep well region 100N having a first doping type is formed in the semiconductor substrate 100. The deep well region 100N is such as an N-type deep well, and the deep well region 100N extends laterally and stops at the isolation structure 600. Next, a heavy doping process with a first doping type is performed on two regions located in the deep well region 100N and adjacent to the surface of the semiconductor substrate 100. The first doping type is such as an N-type doping. The two as-formed heavily doping regions form bit lines 120. Next, an isolation layer 700 is formed on the semiconductor substrate 100, and a hard mask layer 800 is formed on the isolation layer 700. The isolation layer 700 is such as a silicon oxide layer, and the hard mask layer 800 is such as a silicon nitride layer. Next, the recess 100r is formed by performing an etching process between the two heavily doping regions of the bit lines 120. This etching process removes a portion of the semiconductor substrate 100, a portion of the isolation layer 700, and a portion of the hard mask layer 800. Next, a doping process with the first doping type is performed on the semiconductor substrate 100 below the recess 100r for forming a cell implantation region 100c, and the first doping type is such as an N-type doping. As shown in FIG. 2A, an edge of the bit line 120 partially overlaps an edge of the cell implantation region 100c.

As shown in FIG. 2B, an oxide layer 140 is formed in the recess 100r. In the embodiment, a liner oxide is formed on the surface of the recess 100r and then removed (not shown in FIG. 2B), and then a doping process is performed on two side regions in the semiconductor substrate 100, the two side regions being below the recess 100r and adjacent to the bit lines 120, for forming two word line Vt implantation regions 130. And then, the oxide layer 140 is formed in the recess 100r. In the embodiment, the oxide layer 140 is formed by such as oxidizing the surface of the recess 100r. In the embodiment, the oxide layer 140 is such as a silicon oxide layer and can be used as a gate oxide layer for the word lines.

As shown in FIG. 2C, the recess 100r is filled with a gate material 900. In the embodiment, the gate material is such as polysilicon. In the embodiment, the gate material can be deposited in the recess 100r, and then the top surface of the gate material is polished and planarized by a chemical mechanical polishing (CMP) process according to the hard mask layer 800. And then, the gate material may be further etched making the top surface of the gate material lower than the top surface of the hard mask layer 800, such that the top surface of the gate material 900 can be more uniform and flat after being polished.

Next, a hard mask material is deposited on the top surface of the gate material 900 for forming the fully-planar hard mask layer 800 as shown in FIG. 2D. Accordingly, the as-formed hard mask layer 800 can protect the top surface of the gate material 900.

As shown in FIG. 2E, the gate material 900 is etched for forming two word lines 240 on two sidewalls of the recess 100r. In the embodiment, the portion of the gate material 900 located between the two word lines 240 is fully etched, and the oxide layer 140 on the bottom of the recess 100r is also etched and exposed, forming a thinned oxide layer 140' having a reduced thickness. In addition, as shown in FIG. 2E, a portion of the hard mask layer 800 and a portion of the isolation layer 700 are removed by the etching process as well.

As shown in FIG. 2F, the recess 100r is filled with a gate material 910. In the embodiment, the gate material is such as polysilicon. In the embodiment, a cleaning process is performed on the sidewalls of the word lines 240 and the thinned oxide layer 140' on the bottom of the recess 100r; for example, diluted hydrofluoric acid (DHF) is used to clean off the oxides remained on the surfaces. And then, a tunnel oxide layer 920 is formed on the sidewalls of the word lines 240 and on the thinned oxide layer 140' on the bottom of the recess 100r. Next, the gate material 910 is filled in the recess 100r and on the tunnel oxide layer 920. In the embodiment, the gate material 910 may be deposited on the tunnel oxide layer 920 in the recess 100r, and then the top surface of the gate material 910 is polished and planarized by a CMP process according to the hard mask layer 800.

Next, as shown in FIG. 2G, the gate material 910 is etched rendering the top surface 9101 lower than the top surface of the hard mask layer 800.

Next, as shown in FIG. 2H, a memory material layer 930 is formed on the hard mask layer 800 and on the gate material 910 in the recess 100r. In the embodiment, the memory material layer 930 is such as a composite material layer; for example, the memory material layer 930 may include a silicon oxide layer 931, a silicon nitride layer 932, and a silicon oxide layer 933, as shown in FIG. 2H.

Next, as shown in FIG. 2I, the recess 100r is filled with a gate material 940. In the embodiment, the gate material is such as polysilicon. In the embodiment, the gate material 940 may be deposited on the memory material layer 930 in the recess 100r, and then the top surface of the gate material 940 is polished and planarized by a CMP process. In the present CMP process, the memory material layer 930 located on the hard mask layer 800 is polished and removed, and the hard mask layer 800 is polished and thinned.

As such, two gate material layers (i.e. the gate material 910 and the gate material 940) and a memory material layer 930 are formed in the recess 100r, and the memory material layer 930 is located between the two gate material layers (i.e. the gate material 910 and the gate material 940).

Next, a hard mask material is deposited on the top surface of the gate material 940 for forming the fully-planar hard mask layer 800 as shown in FIG. 2J. Accordingly, the as-formed hard mask layer 800 can protect the top surface of the gate material 940.

Next, the two gate material layers (i.e. the gate material 910 and the gate material 940) are etched for forming two floating gates and two control gates. The manufacturing method of etching the two gate material layers (i.e. the gate material 910 and the gate material 940) may include such as the steps as shown in FIGS. 2K-2M.

As shown in FIG. 2K, the gate material 940 is etched for forming two control gates 230 adjacent to the two sides of the two word lines 240. In the embodiment, the portion of the gate material 940 located between the two control gates 230 is fully etched, and a portion of the memory material layer 930 below the gate material 940 is etched as well, leaving the exposed thinned silicon oxide layer 933' having a reduced thickness located on the gate material 910. In addition, as shown in FIG. 2K, a portion of the hard mask layer 800 is removed by the etching process as well.

As shown in FIG. 2L, a memory material layer 950 is formed on sidewalls (i.e. sides 2302) of the two control gates 230. In the embodiment, the memory material layer 950 is such as a composite material layer and may include, for example, a silicon oxide layer 951, a silicon nitride layer 952, and a silicon oxide layer 953, as shown in FIG. 2L. In the embodiment, a fully-planar memory material layer (e.g. a composite layer of a silicon oxide layer, a silicon nitride layer, and a silicon oxide layer) may be formed on the sidewalls of the control gates 230, the thinned silicon oxide layer 933' and the hard mask layer 800. Next, an etching process is performed to remove a portion of the memory material layer located on the hard mask layer 800, a portion of the memory material layer located on the thinned silicon oxide layer 933', and the thinned silicon oxide layer 933', leaving only the memory material layer 950 remained on the sidewalls of the two control gates 230.

Next, as shown in FIG. 2M, the gate material 910 is etched for forming the two floating gates 220 respectively located next to the two sides of the two word lines 240 and for forming the two control gates 230 respectively located on the floating gates 220. In the embodiment, the two sides 2202 of the two floating gates 220 are aligned with the two sidewalls 951s of the silicon oxide layers 951 of the two memory material layers 950. And then, as shown in FIG. 2M, a doping process with a first doping type (e.g. an N-type doping) is performed on the semiconductor substrate 100 located below the recess 100r and between the two floating gates 220 for forming the source line 110.

As such, as shown in FIG. 2M, the control gates 230 are formed on the floating gates 220, and the word lines 240 are formed on the first sides 2201 of the floating gates 220 and the first sides 2301 of the control gates 230.

Next, as shown in FIG. 2N, the silicon oxide layer 951 on the sidewalls of the control gates 230 and on the bottom of the recess 100r and the oxide layer including the thinned oxide layer 140' and the tunnel oxide layer 920 located on the source line 110 are removed for exposing the silicon nitride layer 952 and a portion of the surface of the semiconductor substrate 100 at the bottom of the recess 100r.

As shown in FIG. 2O, an oxide layer 960 is formed on the silicon nitride layer 952, the sides 2202 of the floating gates 220, and the portion of the surface of the semiconductor substrate 100 at the bottom of the recess 100r. For example, in an embodiment, and oxidation process can be performed on the silicon nitride layer 952, the sides 2202 of the floating gates 220, and the portion of the surface of the semiconductor substrate 100 at the bottom of the recess 100r, such that the portion of the oxide layer 960 located on the sides 2202 of the floating gates 220 and the bottom of the recess 100r is silicon oxide, and the portion of the oxide layer 960 located on the silicon nitride layer 952 is silicon oxynitride. In another embodiment, a fully-planar silicon oxide as the oxide layer 960 can be deposited on the sides 2202 of the floating gates 220, the bottom of the recess 100r, and the silicon nitride layer 952. In the embodiment, the oxide layer 960 on the bottom of the recess 100r, the tunnel oxide layer 920, and the thinned oxide layer 140' form the floating gate dielectric 210 as shown in FIG. 1. The floating gate dielectric 210 is formed in the recess 100r, and the floating gates 220 are formed on the floating gate dielectric 210 (i.e. the tunnel oxide layer 920 and the thinned oxide layer 140').

Next, as shown in FIG. 2P, the erase gate 250 is formed between the two floating gates 220 and between the two control gates 230. In the embodiment, a gate material can be deposited on the oxide layer 960 in the recess 100r, and then the top surface of the gate material is polished and planarized by a CMP process according to the hard mask layer 800. And then, the gate material is further etched to make the top surface of the gate material lower than the top surface of the hard mask layer 800 and coplanar with the top surfaces of the control gates 230. As such, the erase gate 250 is formed. As shown in FIG. 2P, the source line 110 is located below the erase gate 250.

As shown in FIG. 2Q, the hard mask layer 800 is removed. In the embodiment, for example, a CMP process can be used to remove the hard mask layer 800, a portion of the silicon nitride layer 952, a portion of the silicon oxide layer 953, and a portion of the oxide layer 960 (e.g. silicon oxide), and the top surfaces of the word lines 240, the control gates 230, and the erase gate 250 are planarized. Next, an oxide material (e.g. silicon oxide) may be optionally deposited, such that the oxide material together with the silicon oxide of the isolation layer 700 may form a fully-planar silicon oxide layer, and this fully-planar silicon oxide layer is located on the surfaces of the word lines 240, the control gates 230, the erase gate 250, the isolation structure 600, and the semiconductor substrate 100.

As such, as shown in FIG. 2Q, the silicon nitride layer 952, the silicon oxide layer 964, and oxide layer 960 (e.g. silicon oxide), and the memory material layer 930 form the memory structure 280, and the memory structure 280 is located on the sidewalls of the control gates 230. In addition, as shown in FIG. 2Q, the non-volatile memory cell 200 is formed. In the present embodiment, the top surface 200a of the non-volatile memory cell 200 is coplanar with the top surface 100a of the semiconductor substrate 100. In another embodiment, the top surface 200a of the non-volatile memory cell 200 can be made below the top surface 100a of the semiconductor substrate 100 by an etching process (not shown in drawings).

Next, as shown in FIG. 2R, the logic gate 300 is formed on the semiconductor substrate 100. In the embodiment, the logic gate 300 may include a high-voltage gate. In other words, the logic gate 300 may belong to a high-voltage component, a low-voltage logic component, or a combined component of the above two. As shown in FIG. 2R, the logic gate 300 includes a gate conductive layer 310, and the gate conductive layer 310 has a height H1 of about 500-550 Å. Furthermore, a silicon nitride layer 320 may be formed on the gate conductive layer 310, and a silicon oxide layer 330 may be formed on the silicon nitride layer 320. As shown in FIG. 2R, the isolation structure 600 is formed in the semiconductor substrate 100 and located between the non-volatile memory cell 200 and the logic gate 300. In other words, the isolation structure 600 separates the region of the non-volatile memory cell 200 from the region of the high-voltage and/or low-voltage logic component(s).

And then, referring to FIG. 1, a silicide layer 290 may be further formed on the top surfaces of the word lines 240, the control gates 230, and the erase gate 250. Moreover, an interlayer dielectric 400 may be further formed on the semiconductor substrate 100, and the top surface 200a of the non-volatile memory cell 200 is under a bottom surface 400b of the interlay dielectric 400. Furthermore, a contact plug 500 may be further formed in the interlayer dielectric 400, and the contact plug 500 is electrically connected to the non-volatile memory cell 200.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
   a semiconductor substrate;
   a non-volatile memory cell formed in the semiconductor substrate, wherein a top surface of the non-volatile memory cell is coplanar with or below a top surface of the semiconductor substrate;
   an oxide layer formed on the semiconductor substrate;
   an interlayer dielectric formed on the semiconductor substrate;
   a logic gate formed in the interlayer dielectric and on the oxide layer, wherein a bottom surface of the logic gate is above the top surface of the non-volatile memory cell;

a contact plug formed in the interlayer dielectric, wherein the top surface of the non-volatile memory cell is under a bottom surface of the interlayer dielectric and the contact plug, and the contact plug is electrically connected to the non-volatile memory cell; and a bit line formed in the semiconductor substrate, wherein a top surface of the bit line is coplanar with the top surface of the non-volatile memory cell;

wherein the non-volatile memory cell comprises:

a floating gate dielectric;

a floating gate formed on the floating gate dielectric;

a control gate formed above the floating gate;

a word line formed on a first side of the floating gate and a first side of the control gate; and an erase gate formed on a second side of the floating gate and a second side of the control gate, the second sides being opposite to the first sides of the floating gate and the control gate.

2. The semiconductor structure according to claim 1, further comprising:

a source line formed below the erase gate;

wherein the bit line is located on a lateral side of the word line opposite to the floating gate and the control gate.

3. The semiconductor structure according to claim 1, wherein the non-volatile memory cell further comprises:

a memory structure formed on sidewalls of the control gate.

4. The semiconductor structure according to claim 1, wherein the non-volatile memory cell further comprises:

a silicide layer formed on top surfaces of the word line, the control gate, and the erase gate.

5. The semiconductor structure according to claim 1, further comprising:

an isolation structure formed in the semiconductor substrate and located between the non-volatile memory cell and the logic gate.

6. The semiconductor structure according to claim 1, wherein the non-volatile memory cell has a first depth extending toward inside of the semiconductor substrate, the logic gate has a first height, and the first depth is larger than the first height.

7. The semiconductor structure according to claim 1, wherein the logic gate comprises:

a high-voltage gate.

* * * * *